(12) United States Patent
Zhiyu et al.

(10) Patent No.: US 7,750,758 B2
(45) Date of Patent: Jul. 6, 2010

(54) MULTI-RING RESONATOR SYSTEM AND METHOD

(75) Inventors: Pan Zhiyu, Shanghai (CN); Robert Candler, Palo Alto, CA (US); Markus Lutz, Los Altos, CA (US); Aaron Partridge, Cupertino, CA (US); Gary Yama, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 131 days.

(21) Appl. No.: 11/850,625

(22) Filed: Sep. 5, 2007

(65) Prior Publication Data

US 2009/0058561 A1 Mar. 5, 2009

(51) Int. Cl.
*H03H 9/46* (2006.01)
*H03H 9/48* (2006.01)

(52) U.S. Cl. .................................. 333/186; 333/199
(58) Field of Classification Search .................. 333/186, 333/199
See application file for complete search history.

(56) References Cited

U.S. PATENT DOCUMENTS

| 7,227,432 | B2* | 6/2007 | Lutz et al. ................. 333/186 |
| 7,323,952 | B2* | 1/2008 | Pan et al. ................. 333/186 |
| 7,436,271 | B2* | 10/2008 | Weinstein et al. ........... 333/186 |
| 2005/0206479 | A1* | 9/2005 | Nguyen et al. ............. 333/186 |
| 2007/0252485 | A1* | 11/2007 | Kawakubo et al. .......... 310/365 |

* cited by examiner

*Primary Examiner*—Robert Pascal
*Assistant Examiner*—Alan Wong
(74) *Attorney, Agent, or Firm*—Courtney Staniford & Gregory LLP

(57) ABSTRACT

A system and method are provided which includes ring resonator structures coupled together with beam structure(s). The ring resonators are configured to operate in the contour or breathe mode. The center of the coupling beam structure is used as a nodal anchor point for anchoring the ring resonators and the beam structures, and also provides a reflecting interface. In an embodiment, the coupling beam structure includes two quarter-wavelength matched beams and an anchor located at a nodal point for coupling the two quarter-wavelength matched beams and ring resonator structures. The symmetric ring design also provides a differential drive and sense configuration while balancing the driving forces about the anchor located at the center of the beam structure. The system exhibits low energy losses while providing large sensing signals and a high quality factor (Q) of about 186,000 at a resonant frequency of about twenty-nine (29) MHz.

17 Claims, 8 Drawing Sheets

MULTI-RING RESONATOR SYSTEM AND METHOD

BACKGROUND

Mechanically vibrating devices are widely used in communication and other systems that require frequency selection or a frequency reference for various operations. Although quartz-based resonant devices and other acoustic devices, such as film bulk acoustic resonator (FBAR) technologies, have been used in the many different products, these devices require a significant amount of area. Moreover, these devices are difficult to integrate with the associated control circuitry. On the other hand, silicon-based microelectromechanical systems (MEMS) are attractive for their potential to be compact, single-chip integrated frequency references and/or filters. MEMS generally refer to an integration of mechanical elements, sensors, actuators, and sometimes electronics on a common silicon substrate. The electronics portions of the MEMS may be fabricated using known integrated circuit (IC) processes, while the micromechanical components are typically fabricated by selectively etching portions of or adding new structural layers to a silicon substrate.

This technology is becoming more sophisticated and continues to expand into new areas, fostering a wide range of new applications, in the wireless industry for example. Vibrating micromechanical resonators are emerging as attractive candidates for on-chip versions of the high-Q mechanical passive components used in transceivers for wireless communication applications. Micromechanical resonators are particularly attractive due to the small size, close to zero direct current (DC) power consumption, and the potential use of IC fabrication technologies to enable on-chip integration of frequency selective components having high quality factors (Qs). Recently, MEMS resonators have demonstrated mechanical Qs over 10,000 for frequencies in the gigahertz (GHz) range. Also, MEMS resonators having parts-per-million (ppm) level long term stability and temperature stability have been demonstrated. These and other features make the MEMS resonator feasible for communication grade applications.

Unfortunately, however, the resonant frequency of a MEMS resonator is generally dependent on its geometry. It follows that the geometrical dependence may result in resonant frequencies that are sensitive to unavoidable process variations. Moreover, the resonant frequencies may be unrepeatable due to the process variations. For example, an undesirable resonant frequency shift may result from certain geometric process variations, such as an undercut. Geometric process variations may inadvertently increase or decrease the operational frequency of a device as the dimensions fluctuate. Thus, unavoidable process variations during device manufacture may lead to unrepeatable resonant and operational frequencies, resulting in a device or system that has unpredictable operational characteristics.

DETAILED DESCRIPTION

Embodiments of a system and method are provided which includes two or more ring resonator structures coupled together with a beam structure. A "resonator" refers to a structure or structures having, or capable of having, a desired mechanical or electro-mechanical vibration. A narrow ring design for a resonator structure may minimize resonant frequency fluctuations due to feature variations which occur during a fabrication process. When excited, the ring resonators are configured to operate in the contour or breathe mode. The center of the coupling beam structure may be used as a nodal anchor point for anchoring the ring resonators and the beam structure, and also provides a reflecting interface for the ring resonator structures.

In an embodiment, the coupling beam structure that couples the two ring resonators have a half wavelength frequency response which assists in facilitating the ring resonator structures to operate in the breathe mode, while suppressing other low frequency flexural modes. In one embodiment, the coupling beam structure includes two quarter-wavelength matched beams and an anchor located at a nodal point for coupling the two quarter-wavelength matched beams and ring resonator structures. The interface at the coupling of the two quarter-wavelength matched beams may be used as a reflecting interface for minimizing feedthrough capacitance and increasing energy output by the resonator system.

In another embodiment, the symmetric ring design provides a differential drive and sense mechanism while balancing the driving forces about the anchor located at the center of the beam structure. The breathe mode ring resonator structure has the capacity to provide large signals and may be used for sensing and driving. Moreover, capacitive feedthrough may be minimized at the central anchor. The system provides a symmetrical and robust resonating structure which exhibits low energy losses while providing large sensing signals and a high quality factor (Q).

In an embodiment, a polysilicon micromechanical or microelectromechanical resonator system is configured to attain a resonant frequency of about twenty-nine (29) MHz with a Q of about 186,000.

Figure 1:
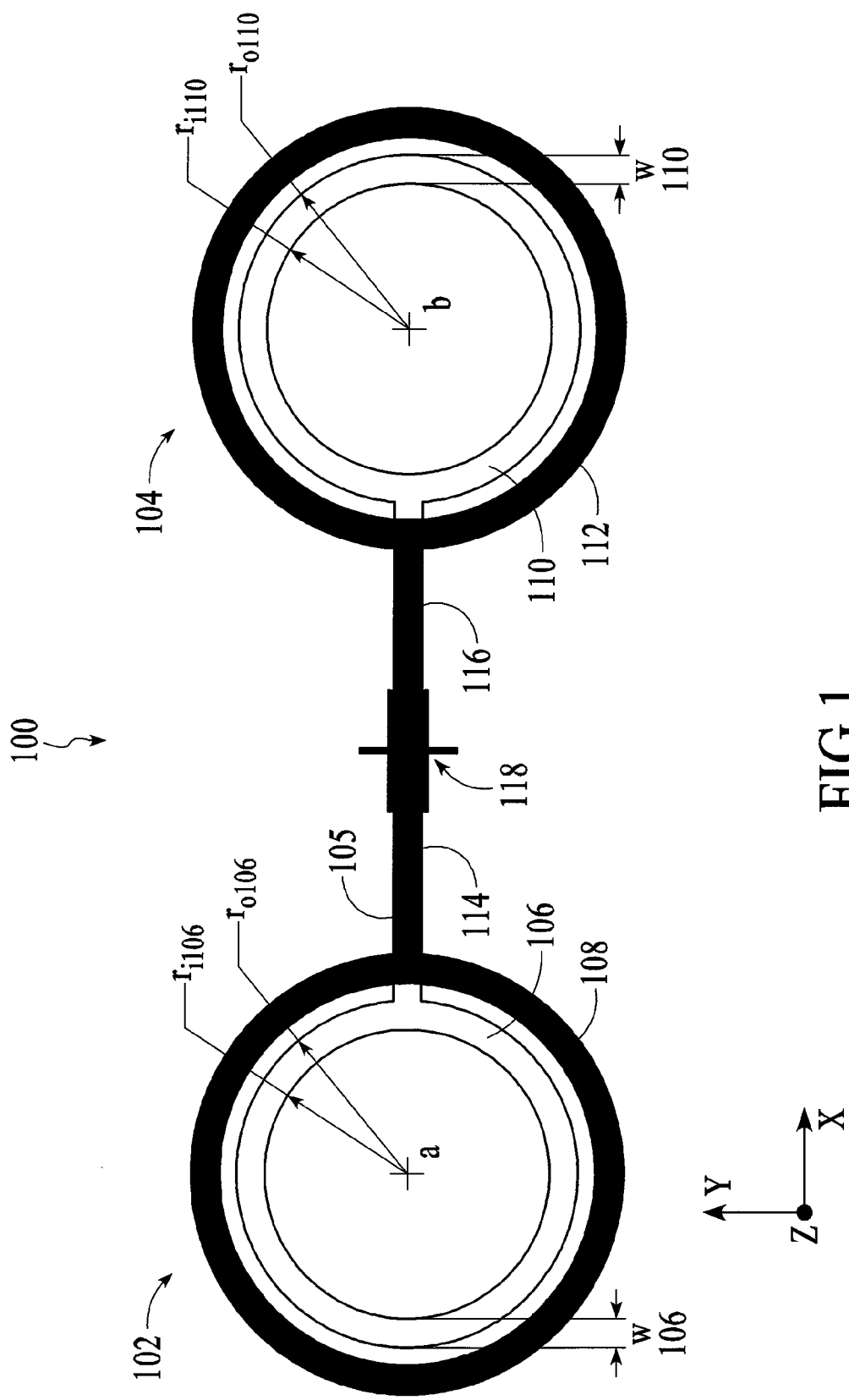
FIG. 1 is a schematic representation of a micromechanical resonator system, according to an embodiment.

FIG. 1 is a schematic representation of a micromechanical resonator system 100, according to an embodiment. The micromechanical resonator system 100 includes a first resonator structure 102 and a second resonator structure 104. The first resonator structure 102 and second resonator structure 104 are coupled together with a beam structure 105, described further below. The first resonator structure 102 includes a ring 106. When excited the ring 106 may expand or compress. An exemplary expansion of ring 106 is represented by ring 108. The ring 106 includes an inner radius $r_{i106}$, outer radius $r_{o106}$, width $w_{106}$ (where $r_{o106}=r_{i106}+w_{106}$), and thickness. In an embodiment, the ring 106 includes an inner radius $r_{i106}$ of about 42 μm, outer radius $r_{o106}$ of about 52 μm, and a width $w_{106}$ of about 10 μm.

The second resonator structure 104 also includes a ring 110. When excited the ring 110 may expand or compress. An exemplary expansion of ring 110 is represented by a ring 112. The ring 110 includes an inner radius $r_{i110}$, outer radius $r_{o110}$, width $w_{110}$ (where $r_{o110}=r_{i110}+w_{110}$), and thickness. In an embodiment, the ring 110 includes an inner radius $r_{i110}$ of about 42 μm, outer radius $r_{o110}$ of about 52 μm, and a width $w_{110}$ of about 10 μm. The first resonator structure 102 and the second resonator structure 104 may also be referred to as a double-ring resonator.

As shown in FIG. 1, in accordance with an embodiment, the beam structure 105 includes a first narrow quarter wavelength beam 114 coupled to a second narrow quarter wavelength beam 116 via an anchor 118. That is, the beam lengths are designed to correspond to a quarter wavelength of the operating or resonant frequency of the micromechanical resonator system 100 which assists the ring structures to achieve the breathe mode. The beam structure 105 is configured to operate in a longitudinal vibration mode and includes a node point at the center of the beam structure 105 which is used for anchoring the anchor 118. The center of the beam structure 105 provides a reflecting interface, while also providing the nodal anchor point for anchoring the first and second resonator structures 102 and 104, and the beam structure 105.

The beam structure 105 may also be referred to as a center half wavelength beam or center half wavelength matching longitudinal resonator, due to the frequency characteristics (described below with reference to FIGS. 2A-2E) obtained by coupling the two quarter wavelength beams 114 and 116 together to form the beam structure 105. The beam structure 105, also referred to as the center half wavelength matching longitudinal resonator, is used as both coupling part and anchor for the symmetric ring micromechanical resonator structures 102 and 104, respectively. While certain configurations and dimensions are described herein, the dimensions and configuration may change depending on a particular implementation and/or fabrication process.

The high Q exhibited by the micromechanical resonator system 100 results in part from minimal energy dissipation due to the wave propagation characteristics associated with the micromechanical resonator system 100. The double quarter wavelength narrow beam structure 105 is configured to minimize the amount of energy dissipated by the micromechanical resonator system 100. As described above, when excited, the symmetric ring design exhibits vibrational characteristics associated with a contour or breathe mode. The symmetric ring design also allows for a differential drive and sense mechanism while all the driving forces are balanced about the anchor 118. That is, the first and second resonator structures 102 and 104 each include a central quarter wavelength termination point, and are coupled together to permit differential driving and/or sensing, as discussed below.

According to an embodiment, the micromechanical resonator system 100 is manufactured as a polysilicon structure by means of polysilicon processing techniques, such as wafer scale vacuum encapsulation and other silicon manufacturing processes. However, the micromechanical resonator system 100 is not limited to polysilicon and other silicon processing techniques or materials. In one embodiment, the micromechanical resonator system 100 may be fabricated as a single wafer hermetic vacuum package at a pressure of less than about 1.5 Pascals (Pa). The polysilicon micromechanical resonator system 100 is configured to exhibit a resonant frequency of about twenty-nine (29) MHz with a Q of about 186,000 at room temperature, thereby providing a high frequency, high Q bulk acoustic wave resonator. As shown further below, the micromechanical resonator system 100 has shown that the resonant frequency may be independent of process induced feature variations, partially due to the narrow dimensioning and configuration of the ring and beam structures.

For example, it has been demonstrated that the center frequency of a breathe mode ring resonator may be independent of the process undercut. As discussed below, the resonant frequency of the micromechanical resonator system 100 only varies about 0.11% over a ring width variation of +/−1 μm. By reducing the effect of process-induced feature variations on the resonant frequency of the micromechanical resonator system 100, the system 100 exhibits more predictable and reliable operational characteristics. Additionally, when the micromechanical resonator system 100 is implemented as part of another system, such as a communication system, the system may operate in a more predictable and reliable manner.

The behavior of a micromechanical resonator or microelectromechanical (MEMS) resonator, such as a bulk acoustic wave resonator, may be analyzed using wave theory concepts. Such a resonator is typically represented as a full-cycle or half-cycle standing wave. A breathe mode ring resonator may be represented as a full-cycle standing wave when the ring shape is narrow or when the ring width "w" is much smaller as compared to the ring inner radius $r_i$. ($w \ll r_i$) (see FIGS. 2A-2C). In order to optimize the design of a breathe mode ring resonator, the resonant behavior of the breathe mode ring resonator may be examined. Accordingly, it has been observed that the breathe mode ring resonator simultaneously extends and compresses when excited. This simultaneous extension and compression is partially due to the fact that one full wavelength longitudinal wave vibrates across the ring circumference when the ring resonator is excited.

Figure 2A:
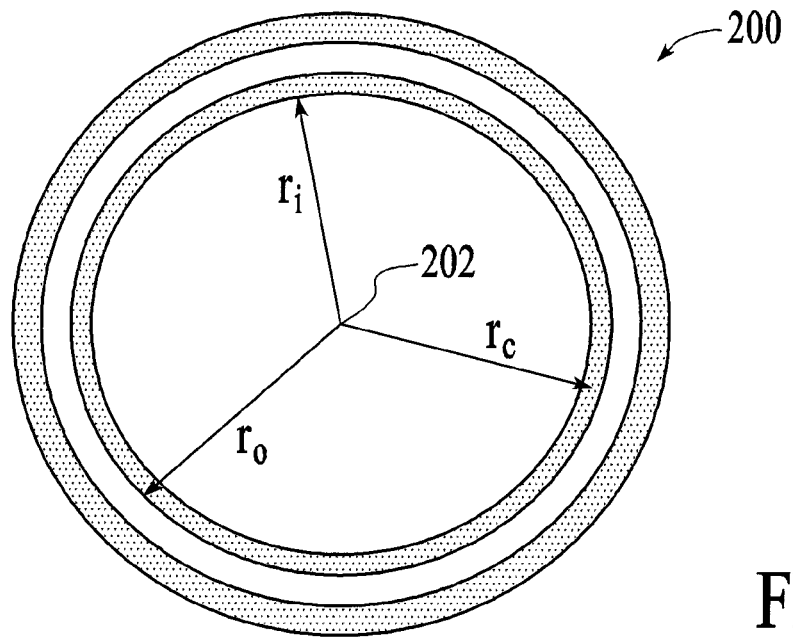
FIG. 2A is a schematic representation of a breathe mode ring resonator.

FIG. 2A is a schematic representation of a breathe mode ring resonator 200. The breathe mode ring resonator 200 includes an inner radius $r_i$, outer radius $r_o$, width w, and a center radius $r_c$. As described above, when excited, the breathe mode ring resonator 200 operates in a contour or breathe mode, extending and compressing about an axis 202.

Figure 2B:
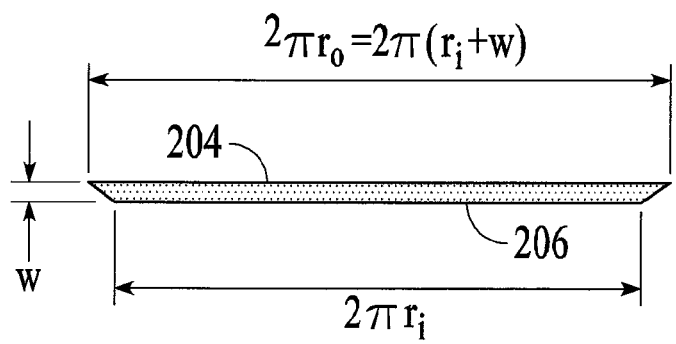
FIG. 2B is a schematic representation of a breathe mode ring resonator represented as a longitudinal beam resonator.

FIG. 2B is a schematic representation of the breathe mode ring resonator 200 if the ring were to be cut and laid flat. As shown in FIG. 2B, once cut and laid flat, the breathe mode ring resonator 200 resembles a regular bar. One edge 204 of the bar has a length of about $2\pi*r_o$, which is equal to $2\pi(r_i+w)$. The opposite edge 206 of the bar has a length of about $2\pi*r_i$.

Figure 2C:
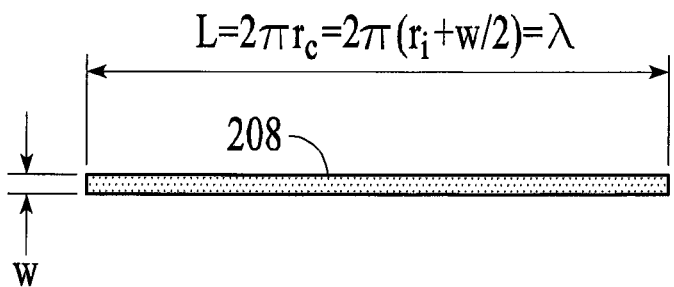
FIG. 2C is a schematic representation of a breathe mode ring resonator represented as a longitudinal mode beam when the ring width (w) is much smaller than the inner radius $r_i$ (w<<$r_i$) of the ring.

FIG. 2C is a schematic representation of the breathe mode ring resonator 200 represented as a longitudinal mode beam 208 when the ring width (w) is much smaller than the inner radius $r_i$ ($w \ll r_i$). The length (L) of the longitudinal mode beam 208 is equal to about $2\pi*r_c$, where $r_c$ is the center edge radius as depicted in FIG. 2A. The length (L) of the longitudinal mode beam 208 may also be represented as $2\pi(r_i+w/2)$, which is equal to $2\pi*r_c$. The quantity $2\pi(r_i+w/2)$, which is equal to the length (L) of the longitudinal mode beam 208 is also equal to the wavelength ($\lambda$) of the longitudinal mode beam 208.

Figure 2D:
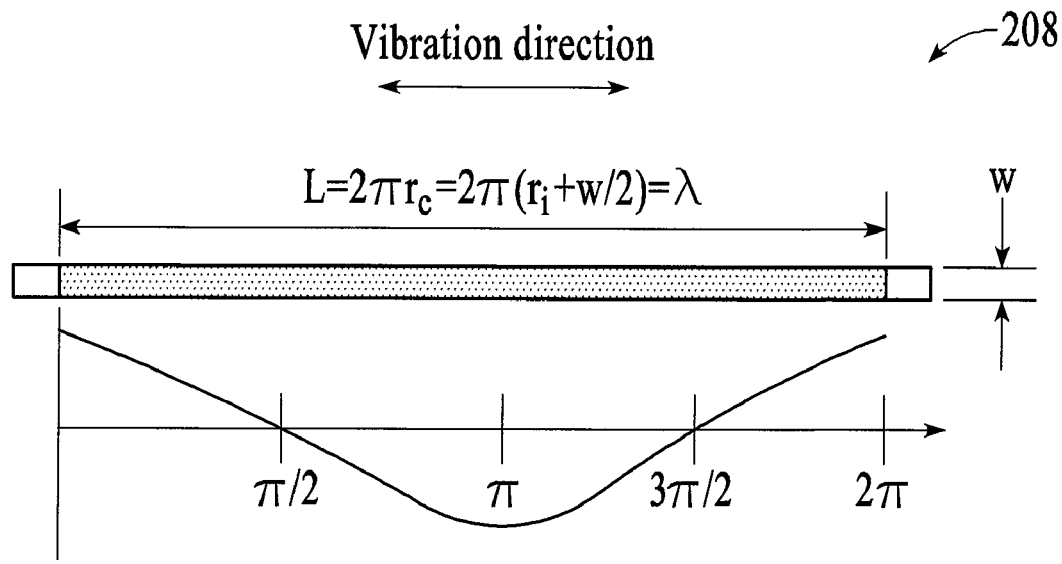
FIG. 2D is a schematic representation of a breathe mode ring resonator represented as a longitudinal mode beam including its vibrational characteristics.

FIG. 2D is a schematic representation of the breathe mode ring resonator 200 represented as a longitudinal mode beam 208 including its vibrational characteristics. That is, the breathe mode ring resonator 200 may be simplified and represented as a beam 208 vibrating in the longitudinal mode along the length direction. The graph depicted below the longitudinal mode beam 208 illustrates its vibrational characteristics. As shown in the graph, the longitudinal mode beam 208 vibrates as a full cycle standing wave along the length direction.

Figure 2E:
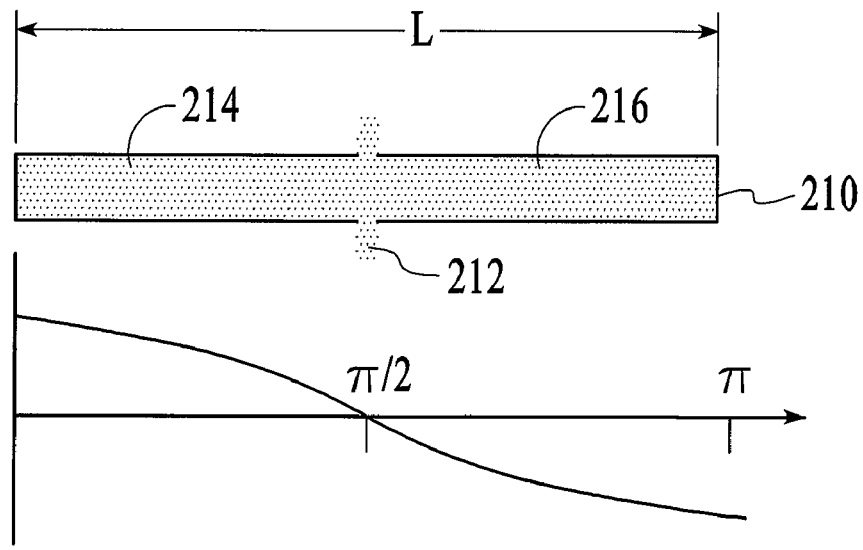
FIG. 2E is a schematic representation of an equivalent standard or conventional longitudinal mode bar including an anchor.

FIG. 2E is a schematic representation of an equivalent standard or conventional longitudinal mode bar or beam 210 including an anchor 212 located at about a central location of the conventional longitudinal mode bar 210. The anchor 212 may be used to couple the longitudinal mode bar 210 to a substrate, device, or system for example. In practice, conventional longitudinal vibrating beams are typically anchored in the center of the beam. As shown in the graph depicted in FIG. 2E, each bar 214 and 216 on either side of the anchor 212 may be characterized as a quarter wavelength vibrating bar coupled at the center of the longitudinal mode bar 210. If one bar 214 is used for driving and the other bar 216 is used for sensing, the length of the longitudinal mode bar 210 is equal to a half wavelength ($\lambda/2$). However, as described above, the breathe mode ring resonator 200 may be characterized as a full wavelength resonator (see FIG. 2D).

Therefore, the fundamental mode resonant frequency of the breathe mode ring resonator 200 may be calculated by using the following equation:

$$f = \frac{1}{2L}\sqrt{\frac{E}{\rho}} = \frac{1}{4\pi(r_i + w/2)}\sqrt{\frac{E}{\rho}} \quad (1)$$

Where,
f is the fundamental mode resonant frequency;
E is the Young's modulus of the structure materials; and
$\rho$ is the mass density of the structure materials.

Equation 1 provides insight as to why the resonant frequency of the breathe mode ring resonator 200 is relatively independent of feature size variations due to fabrication processes. The resonant frequency is also independent of the thickness of the structure to the first order. However, as seen above, the breathe mode ring resonator 200 typically does not include a node point which can be used for anchoring.

According to an embodiment, a quarter wavelength matching beam, such as beams 114 and 116 shown in FIG. 1, may be used to couple the breathe mode ring resonator 200 to an anchor structure or structures. According to the analysis above, the length of a quarter wavelength matching beam may be determined as:

$$L_{beam} = \frac{\lambda}{4} = \frac{L}{4} = \frac{\pi}{2}(r_i + w) \quad (2)$$

Figure 3A:
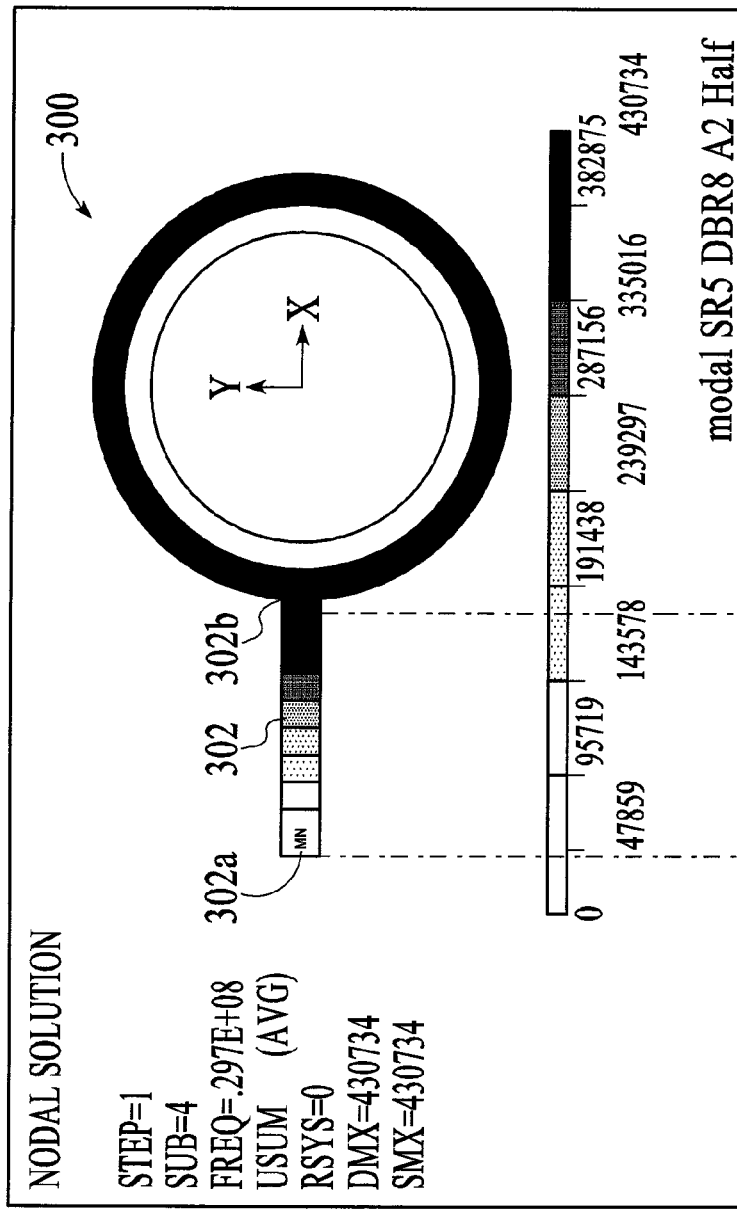
FIG. 3A depicts the results of a finite element analysis simulation and the corresponding waveform analysis of a breathe mode ring resonator coupled to a quarter wavelength matching beam.

FIG. 3A depicts the results of a finite element analysis (FEA) simulation and the waveform analysis of a breathe mode ring resonator 300 coupled to a quarter wavelength matching beam 302. As shown in FIG. 3A, the breathe mode ring resonator 300 coupled to the quarter wavelength matching beam 302 exhibits a resonant frequency of about 29.7 MHz. One end 302a of the quarter wavelength matching beam 302 may be used as an anchor or coupling point. The opposing end 302b may be used to couple the quarter wavelength matching beam 302 to the breathe mode ring resonator 300. The end 302a provides an excellent anchor or coupling point since end 302a corresponds to a nodal point of the wavelength matching beam 302. As described herein, the end 302a of the quarter wavelength matching beam 302 also serves as a reflecting interface when used to couple multiple breathe mode ring resonators.

Figure 3B:
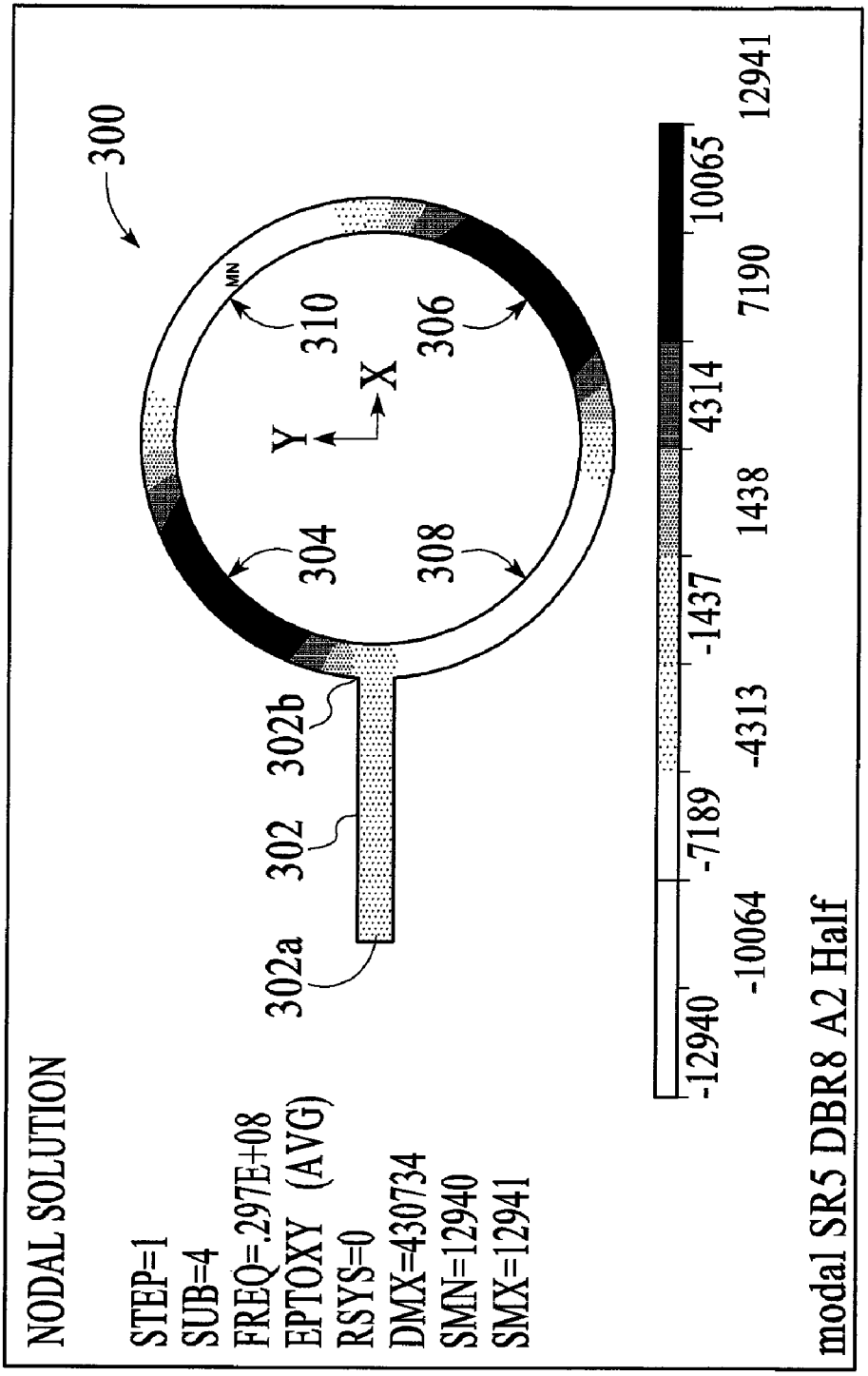
FIG. 3B depicts a finite element strain analysis diagram of the breathe mode ring resonator and the quarter wavelength matching support of FIG. 3A.

FIG. 3B depicts a finite element strain analysis diagram of the breathe mode ring resonator 300 including the quarter wavelength matching support 302. The strain analysis illustrates the vibrational characteristics of the breathe mode ring resonator 300 and the quarter wavelength matching support 302 for a higher harmonic. Arrows 304 and 306 point to locations of the breathe mode ring resonator 300 having a large amount of extension and compression when the breathe mode ring resonator 300 is excited. Whereas, arrows 308 and 310 point to locations of the breathe mode ring resonator 300 having a lesser amount of extension and compression when the breathe mode ring resonator 300 is excited. The strain analysis verifies the operational characteristics of the breathe mode ring resonator 300 and the quarter wavelength matching support 302, as discussed above.

Figure 4:
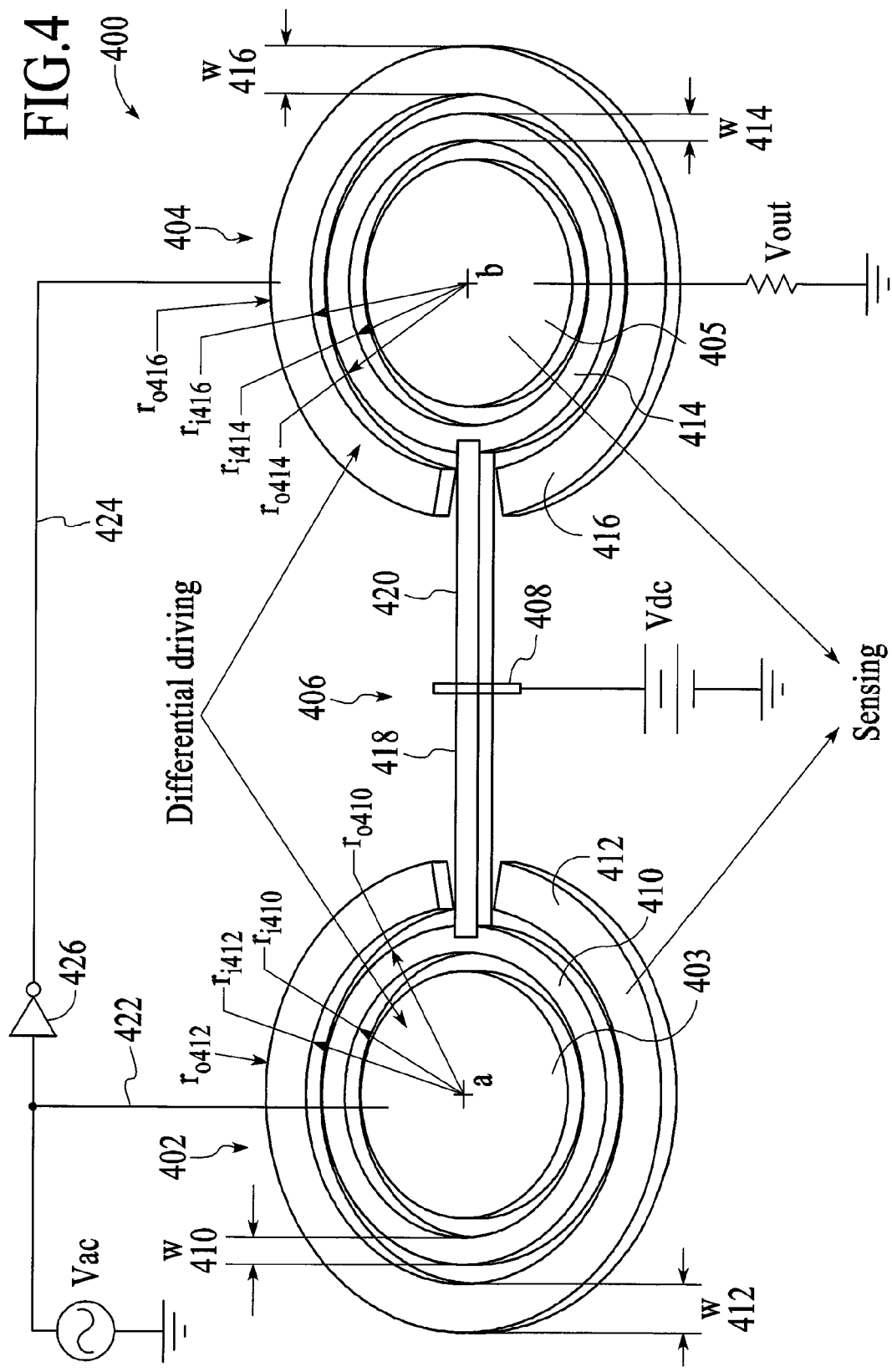
FIG. 4 is a schematic representation of a microelectromechanical resonator, according to an embodiment.

FIG. 4 is a schematic representation of a microelectromechanical resonator system 400, according to an embodiment. The microelectromechanical resonator system 400 includes a first resonator structure 402 and a second resonator structure 404, each resonator structure including an inner ring and an outer ring, but is not so limited. The first resonator structure 402 and the second resonator structure 404 are coupled together with a beam structure 406. The beam structure also includes an anchor 408 which may be used to couple the microelectromechanical resonator system 400 to a substrate, device, system, or other structure for example.

The microelectromechanical resonator system 400 also includes first and second electrodes 403 and 405 for use in driving and sensing for example. As described below, the outer ring 412 of the first resonator structure 402 and the second electrode 405 may be used as sensing outputs, while the outer ring 416 of the second resonator structure 404 and the first electrode 403 may be used as driving inputs. In an alternative embodiment, the outer ring 412 of the first resonator structure 402 and the second electrode 405 may be used as driving inputs, while the outer ring 416 of the second resonator structure 404 and the first electrode 403 may be used as sensing outputs. Other driving and sensing configurations are available.

The first resonator structure 402 includes an inner ring 410 and an outer ring 412. In an embodiment, the inner ring 410 and the outer ring 412 are substantially coaxial with respect to the vertex a. In an embodiment, the inner ring 410 is configured to operate as a breathe-mode resonator and includes an inner radius $r_{i410}$, outer radius $r_{o410}$, a width $w_{410}$ (where $r_{o410} = r_{i410} + w_{410}$), and thickness. The outer ring 412 includes an inner radius $r_{i412}$, outer radius $r_{o412}$, a width $w_{412}$ (where $r_{o412} = r_{i412} + w_{412}$), and thickness. The second resonator structure 404 also includes an inner ring 414 and an outer ring 416. In an embodiment, the inner ring 414 and the outer ring 416 of the second resonator structure 404 are substantially co-axial with respect to the vertex b. In an embodiment, the inner ring 414 is configured to operate as a breathe-mode resonator and includes an inner radius $r_{i414}$, outer radius $r_{o414}$, a width $w_{414}$ (where $r_{o414} = r_{i414} + w_{414}$), and a thickness. The outer ring 416 includes an inner radius $r_{i416}$, outer radius $r_{o416}$, a width $w_{416}$ (where $r_{o416}=r_{i416}+w_{416}$), and a thickness.

As shown in FIG. 4, in accordance with an embodiment, the beam structure 406 includes a first narrow quarter wavelength beam 418 coupled to a second narrow quarter wavelength beam 420 via anchor 408. In an embodiment, the first and second narrow quarter wavelength beams 418 and 420 are coupled to the inner rings 410 and 414. The beam lengths are designed to correspond to a quarter wavelength of the resonating or operating frequency of the microelectromechanical resonator system 400. Additionally, the beam structure 406 is configured to vibrate in a longitudinal vibration mode and includes a node point at its center which may be used for anchoring and coupling the first and second narrow quarter wavelength beams 418 and 420, respectively. As described above, the center or nodal point of the beam structure 406 provides a reflecting interface to reduce capacitive feedthrough and minimize energy dissipation by the microelectromechanical resonator system 400. The microelectromechanical resonator system 400 has been shown to exhibit a high Q at frequencies in the MHz range. The high Q exhibited by the microelectromechanical resonator system 400 results in part due to the amount of energy dissipated by the system 400.

According to an embodiment, the microelectromechanical resonator system 400 is manufactured using polysilicon processing techniques, such as wafer scale vacuum encapsulation and other manufacturing processes. However, the micromechanical resonator system 400 is not limited to polysilicon and other silicon processing techniques or materials. In one embodiment, the microelectromechanical resonator system 400 is fabricated as a single wafer hermetic vacuum package at a pressure of less than about 1.5 Pascals (Pa). The polysilicon microelectromechanical resonator system 400 is configured to exhibit a resonant frequency of about twenty-nine (29) MHz with a Q of about 186,000 at room temperature, thereby providing a high frequency, high Q bulk acoustic wave resonator. As shown further below, the resonant frequency of the microelectromechanical resonator system 400 may be largely independent of process induced feature variations.

In accordance with an embodiment, as shown in FIG. 4, a direct current (DC) bias (Vdc) is applied to the anchor 408 and coupled to ground. An alternating current (AC) drive voltage (Vac) is applied to the first electrode 403 associated with the first resonator structure 402 via electrical conductor 422, and a negative (−Vac) is applied to the outer ring 416 of the second resonator structure 404 via electrical conductor 424 and inverter 426, which excites the microelectromechanical resonator system 400. In such a configuration, the first electrode 403 of the first resonator structure 402 and the outer ring 416 of the second resonator structure 404 form a pair of differential drive electrodes.

The applied voltages collectively create a time-varying electrostatic excitation force between the first electrode 403 and the inner ring 410 of the first resonator structure 402, and between the outer ring 416 and the inner ring 414 of the second resonator structure 404. The time-varying electrostatic force acts radially on the inner rings 410 and 414 at their natural frequencies. The radial driving force operates on the first and second resonator structures 402 and 404, while being balanced about the anchor 408. Through the coupling of the central beam structure 406, the double-ring structures vibrate in the same phase, fully balancing the microelectromechanical resonator system 400 about the anchor 408.

While the microelectromechanical resonator system 400 vibrates, the breathe-motion of the inner rings 410 and 414 will lead to periodic changing of the capacitance between the ring structures and/or the pickup electrodes. This capacitive fluctuation results in an output current signal. According to an embodiment, the outer ring 412 of the first resonator structure 402 and the second electrode of the second resonator structure 404 may be used as sensing electrodes. The applied DC bias (Vdc) coupled with the periodic capacitance fluctuation, generates an AC output current and/or voltage at the sense outputs. This output current may be used to further refine the operational characteristics of the microelectromechanical resonator system 400. The output current may also be filtered to omit undesirable frequencies associated with the operation of the microelectromechanical resonator system 400. However, to simplify the discussion below, one output signal (Iout or Vout) from one sense electrode 405 is analyzed to ascertain the operational characteristics of the system 400.

In order to verify that the resonant frequency is independent of process variation, simulation and the testing data are listed in the Table below for a microelectromechanical resonator system described herein.

TABLE

| | | |
|---|---|---|
| Feature variation | | 0 |
| Inner radius $r_i$ (μm) | | 42 |
| Ring width w (μm) | | 10 |
| Equivalent bar length (μm) $L = \pi(r_i + w/2)$ | | 146.08 |
| Resonant frequency (MHz) | Approximation | 28.81 |
| | FEA simulation | 28.72 |
| | Testing | 28.69 |
| | Frequency mismatch | 0% |
| Equivalent Bar | Frequency (MHz) | 28.81 |
| | Frequency mismatch | 0% |

As shown by the data in the Table above, the equivalent frequency estimation mode given by equation (1) is accurate as compared to the testing result. For a regular longitudinal mode bar, the resonant frequency will shift about 5% of the center frequency for a 30 MHz resonant bar. However, for the breathe mode microelectromechanical resonator system 400, the frequency only shifts about 0.11% for a 2 μm (+1 μm and −1 μm) process feature variation. That is, the resonant frequency of the microelectromechanical resonator system 400 only varies about 0.11% over a ring width variation of +/−1 μm. By reducing the effect of process-induced variations on the resonant frequency, system 400 exhibits predictable and reliable operational characteristics. Additionally, when the microelectromechanical resonator system 400 is implemented as part of another system, such as a communication system, the system may operate in more predictable and reliable manner.

Figure 5:
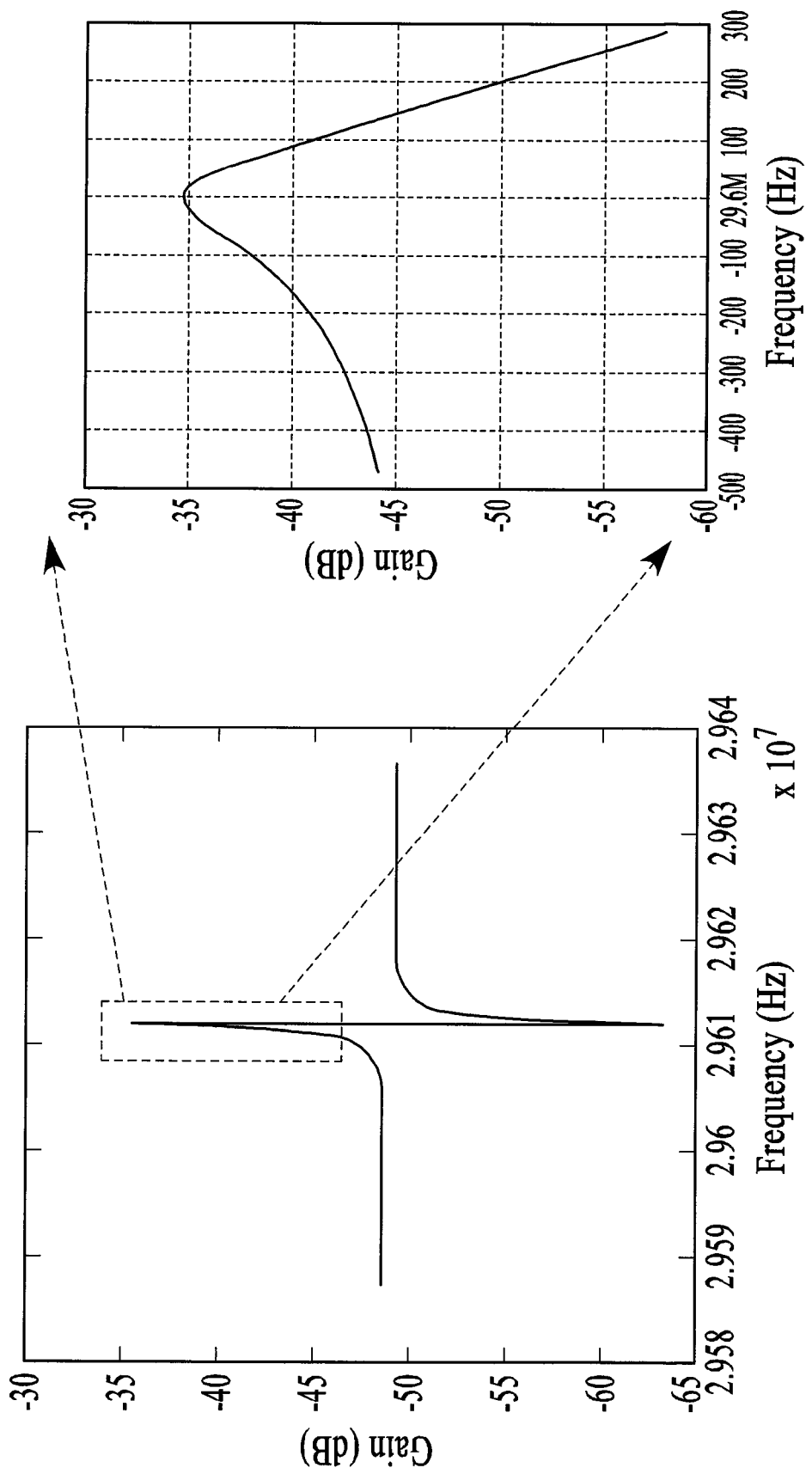
FIG. 5 is a plot of frequency versus gain characteristics of a microelectromechanical resonator, according to an embodiment.

FIG. 5 is a plot of frequency versus gain characteristics for a microelectromechanical resonator, according to an embodiment. As shown in FIG. 5, the microelectromechanical resonator system 400 attains a gain of about negative thirty-five (35) decibels (dB) at a resonant frequency of about 29 MHz. Each inner ring 410 and 414 of the microelectromechanical resonator system 400 included an inner radius of about 41 μm and a width of about 8 μm. The microelectromechanical resonator system 400 attained a Q of about 186,000 when a DC bias (Vdc) of about 35 volts was applied to the anchor 408.

Figure 6:
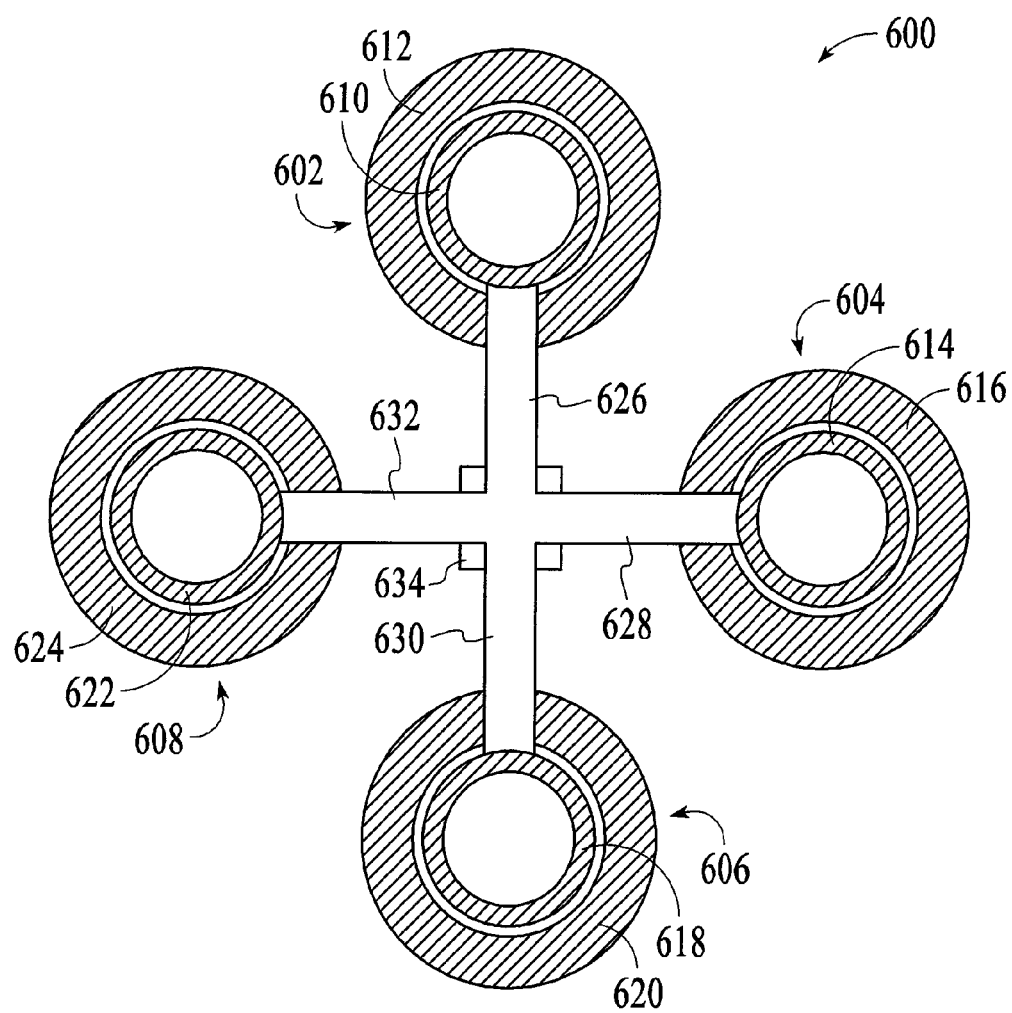
FIG. 6 is a schematic representation of a micromechanical resonator, according to an embodiment.

FIG. 6 is a schematic representation of a micromechanical resonator system 600, according to an embodiment. As shown in FIG. 6, the micromechanical resonator system 600 includes four ring resonator structures 602, 604, 606, and 608. The micromechanical resonator system 600 may also be described as having two double-ring resonator structures comprising rings 610 and 618 and rings 614 and 622. Each ring resonator structure 602, 604, 606, and 608 includes inner rings 610, 614, 618, and 622. The rings 612, 616, 620, and 624 are representative of the expansion of rings 610, 614, 618, and 622 when excited. The micromechanical resonator system 600 also includes four quarter wavelength beams 626, 628, 630, and 632 coupling each ring resonator structure 602, 604, 606, and 608 to a central anchor structure 634. The central anchor structure 634 provides a reflective interface for waves emanating from the ring resonator structures 602, 604, 606, and 608. By acting as a reflective interface, the central anchor structure 634 minimizes undesirable capacitive feedthrough and reduces energy dissipated by the micromechanical resonator system 600. Other ring resonator configurations are also available, and micromechanical resonator systems having other than two and four ring resonator structures are enabled under the description herein.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import, when used in this application, refer to this application as a whole and not to any particular portions of this application. When the word "or" is used in reference to a list of two or more items, that word covers all of the following interpretations of the word: any of the items in the list, all of the items in the list and any combination of the items in the list.

The above description of illustrated embodiments of the invention is not intended to be exhaustive or to limit the invention to the precise form disclosed. While specific embodiments of, and examples for, the invention are described herein for illustrative purposes, various equivalent modifications are possible within the scope of the invention, as those skilled in the relevant art will recognize. The teachings of the invention provided herein can be applied to other systems, not only for the resonator system described above. The elements and acts of the various embodiments described above can be combined to provide further embodiments. These and other changes can be made to the invention in light of the above detailed description.

In general, in the following claims, the terms used should not be construed to limit the method and system to the specific embodiments disclosed in the specification and the claims, but should be construed to include any methods and systems that operate under the claims. Accordingly, the method and system is not limited by the disclosure, but instead the scope of the method and system is to be determined entirely by the claims. While certain aspects of the method and system are presented below in certain claim forms, the inventors contemplate the various aspects of the method and system any number of claim forms. Accordingly, the inventors reserve the right to add additional claims after filing the application to pursue such additional claim forms for other aspects of the method and system.

What is claimed is:

1. A micromechanical system comprising:
   a first resonator structure including a first ring having a first inner radius, a first outer radius, and a first width defined by the distance between the first inner radius and the first outer radius;
   a second resonator structure including a second ring having a second inner radius, a second outer radius, and a second width defined by the distance between the second inner radius and the second outer radius; and
   a coupler for coupling the first resonator structure to the second resonator structure, the coupler comprising two quarter wavelength longitudinal resonators coupling the first resonator structure to the second resonator structure.

2. The micromechanical system of claim 1, wherein the first resonator structure comprises a third ring adjacent to the first ring, and the second resonator structure comprises a fourth ring adjacent to the second ring, wherein the third and fourth rings can be used to excite the first and second rings.

3. The micromechanical system of claim 1, wherein the micromechanical system operates in a breathe mode.

4. The micromechanical system of claim 1, wherein the micromechanical system exhibits a quality factor (Q) greater than about one-hundred and eighty thousand (180,000) while resonating at a frequency greater than about twenty-nine megahertz (MHz).

5. The micromechanical system of claim 1, wherein the coupler comprises a longitudinal beam comprising said two quarter wavelength longitudinal resonators and an anchor structure is located at about a mid-point of the longitudinal beam, wherein the mid-point corresponds to a nodal point of the longitudinal beam.

6. The micromechanical system of claim 5, wherein the first resonator structure and the second resonator structure are symmetrically arranged with respect to the anchor structure and the mid-point of the longitudinal beam provides a reflecting interface between the first resonator structure and the second resonator structure.

7. A microelectromechanical system, comprising:
   a first resonator structure including a first ring, a first electrode, and a second electrode;
   a second resonator structure including a second ring, a third electrode, and a fourth electrode; and
   a third resonator structure coupling the first and second rings of the first and second resonator structures, the third resonator structure comprising a longitudinal resonator.

8. The microelectromechanical system of claim 7, wherein the first electrode is adjacent to the first ring and the third electrode is adjacent to the second ring.

9. The microelectromechanical system of claim 7, wherein the third resonator structure comprises an anchor coupled to a nodal point of the longitudinal resonator.

10. The microelectromechanical system of claim 9, comprising a direct current (DC) bias electrically coupled to the anchor.

11. The microelectromechanical system of claim 10, comprising an alternating current (AC) source electrically coupled to at least one of the first to fourth electrodes.

12. The microelectromechanical system of claim 7, wherein the longitudinal resonator comprises two quarter wavelength beams and an anchor.

13. The microelectromechanical system of claim 7, comprising a DC source electrically coupled to the third resonator structure, and an AC source electrically coupled to at least one of the first to fourth electrodes.

14. A method of using a microelectromechanical system comprising:
   applying a first voltage source to an electrode associated with a first resonator structure having at least one ring and to an electrode of a second resonator structure;
   applying a second voltage source to a structure coupling the first and second resonator structures; and exciting the first resonator structure and the second resonator structure to a resonant frequency, wherein the resonant frequency is associated with a high quality factor (Q).

15. The method of claim 14 comprising applying a DC bias to a node of the structure which couples the first and second resonator structures, and applying an alternating current (AC) voltage source to the electrodes associated with the first and second resonator structures.

16. The method of claim 14 comprising sensing an output signal using another electrode of the first resonator structure.

17. The method of claim 14 comprising sensing an output signal with another electrode associated with the second resonator structure.

* * * * *

UNITED STATES PATENT AND TRADEMARK OFFICE
CERTIFICATE OF CORRECTION

PATENT NO. : 7,750,758 B2  
APPLICATION NO. : 11/850625  
DATED : July 6, 2010  
INVENTOR(S) : Zhiyu et al.

Page 1 of 1

It is certified that error appears in the above-identified patent and that said Letters Patent is hereby corrected as shown below:

On the title page item [73], delete "Robert Bosch GmbH, Stuttgart, DE" and insert --Robert Bosch GmbH, Stuttgart, DE and The Board of Trustees of the Leland Stanford Junior University, Palo Alto, CA--.

Signed and Sealed this
Fourteenth Day of October, 2014

Michelle K. Lee
*Deputy Director of the United States Patent and Trademark Office*